US005095250A

United States Patent [19]

Woodside

[11] Patent Number: 5,095,250

[45] Date of Patent: Mar. 10, 1992

[54] FESTOON LIGHTING

[76] Inventor: Eric Woodside, Hadfield House, Greenhalgh Street, Heaton Norris, Stockport, Cheshire, England

[21] Appl. No.: 598,011

[22] Filed: Oct. 11, 1990

Related U.S. Application Data

[63] Continuation-in-part of Ser. No. 499,066, Mar. 26, 1990.

[30] Foreign Application Priority Data

Aug. 3, 1989 [GB] United Kingdom ................. 8917774

[51] Int. Cl.5 ............................................ H03H 11/28

[52] U.S. Cl. .................................... 315/323; 362/249; 362/391; 362/252

[58] Field of Search ............... 439/417, 419, 404, 425; 362/249, 226, 391; 315/323, 324

[56] References Cited

U.S. PATENT DOCUMENTS 2,483,351 9/1949 Richardson ......................... 439/425
2,800,635 7/1957 Christenbery ....................... 439/419
3,019,393 1/1962 Rockafellow ....................... 315/323
3,609,643 9/1971 Connan ............................ 439/419 X
4,763,232 8/1988 Woodside .......................... 362/249
4,764,708 8/1988 Roudeski ............................. 315/51

FOREIGN PATENT DOCUMENTS 914818 1/1963 United Kingdom ................ 439/419

*Primary Examiner*—Eugene R. Laroche
*Assistant Examiner*—Son Dinh
*Attorney, Agent, or Firm*—Charles J. Brown

[57] ABSTRACT

There is disclosed festoon lighting of the kind referred to whose lampholder fittings comprise a lampholder base including a cylindrical shroud extending from a channel in which a cable may be laid, pins projecting into said channel and a cap having a plurality of angularly spaced depending lugs each with a radially directed tooth on its free end, the cap and base being interengageable by axial pressure to cause the pins to penetrate the cores of a cable laid in said channel and to force the lugs through apertures in a part integral with said shroud whereby the teeth engage with shoulders on the underside of said apertures, the lugs being a close fit within the apertures such that passage of the teeth through the apertures involve elastic deformation of the parts.

4 Claims, 2 Drawing Sheets

FESTOON LIGHTING

CROSS REFERENCE TO RELATED APPLICATION

This application is a continuation-in-part of my co-pending application entitled "Chasing Light System" filed Mar.26, 1990 and given Ser. No. 07/499,066.

BACKGROUND TO THE INVENTION

This invention relates to festoon lighting of the kind (hereinafter termed of the kind referred to) comprising a length of electric cable incorporating at least two cores and a plurality of lampholder fittings connected with the cable at spaced intervals therealong.

One form of festoon lighting comprises a chasing (or running) light system as seen for example at seaside resorts and in fairgrounds, but also generally, for example, at Christmas time, and other local or national festivities, cinemas, theatres and the like. It comprises festoon lighting whose lamps are switched on and off in special sequence to give the impression that light is running or chasing along the cable.

Conventionally the lampholders have been moulded onto the cable. This operation is both time-consuming and costly.

Also known are lampholders comprising parts which lock together by application of axial pressure to cause pins to penetrate the cores of a cable located between the parts. These lampholders have an important disadvantage compared with the ones moulded onto the cable in that they can, after assembly, be dismantled thereby failing to meet the electrical safety regulations of some countries.

It is an object of the present invention to provide a lampholder of this latter kind which once assembled is incapable of being dismantled.

It is a further object of the present invention to provide such a lampholder with space inside to accomodate a miniature circuit assembly for use in chasing light systems.

SUMMARY OF THE INVENTION

According to the present invention there is provided festoon lighting of the kind referred to whose lampholder fittings comprise a lampholder base including a cylindrical shroud extending from a channel in which a cable may be laid, pins projecting into said channel and a cap having a plurality of angularly spaced depending lugs each with a radially directed tooth on its free end, the cap and base being interengageable by axial pressure to cause the pins to penetrate the cores of a cable laid in said channel and to force the lugs through apertures in a part integral with said shroud whereby the teeth engage with shoulders on the underside of said apertures, the lugs being a close fit within the apertures such that passage of the teeth through the apertures involve elastic deformation of the parts.

There may be four lugs.

The channel may be separable from the lampholder base to give access to space within the base to house a miniature circuit assembly.

The invention will be further apparent from the following description with reference to the several figures of the accompanying drawings, which show, by way of example only, one form of festoon lighting embodying same.

DESCRIPTION OF PREFERRED EMBODIMENT

Figure 1:
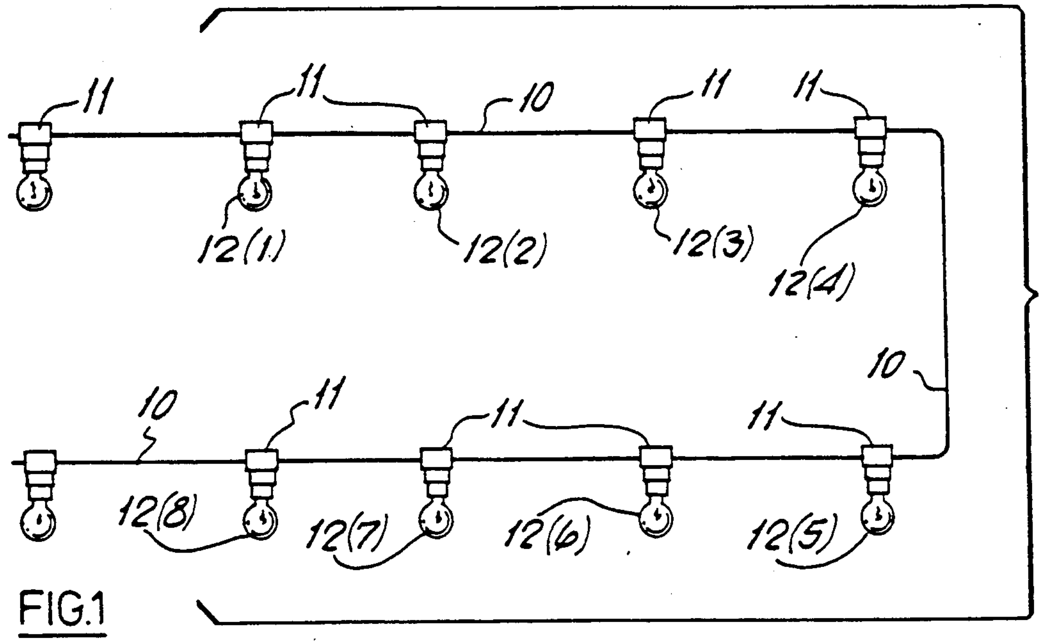
FIG. 1 shows a length of festoon lighting.

As seen in FIG. 1, the festoon lighting comprises a length of cable 10 having spaced lampholders therealong equipped with lights 12.

Figure 3:
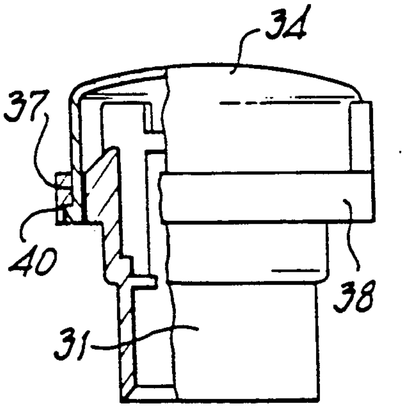
FIG. 3 is a partially sectioned side elevation of the lampholder of FIG. 2.
Figure 2:
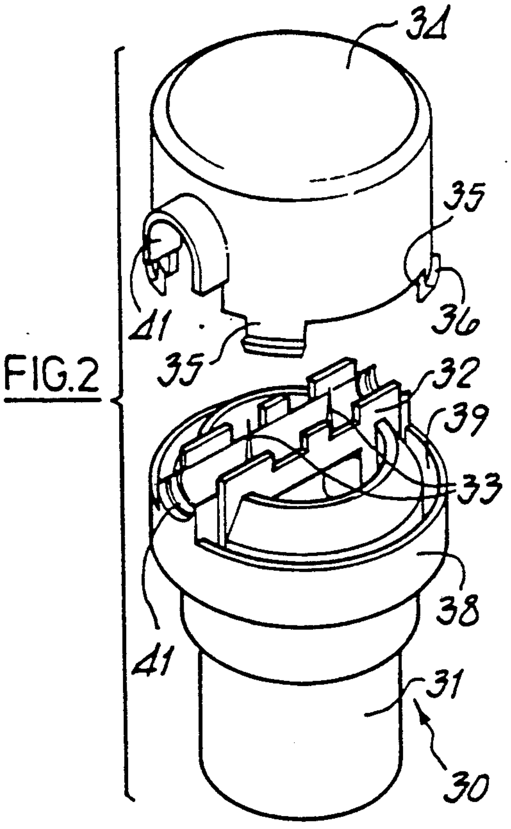
FIG. 2 is an exploded perspective view of a lampholder.

As shown in FIGS. 2 and 3 each lampholder comprises a base 30 including a cylindrical shroud 31 extending from a channel 32 in which a cable may be laid. Pins 33 project into the channel.

In a modification, and for a purpose which will be apparent hereinafter, the channel 32 and pins 33 may be separate from the remainder of the base.

The lampholder further comprises a cap 34 having four equi-angularly spaced depending lugs 35, each of which has an outwardly radially directed tooth 36 on its free end. The cap 34 and base 30 are interengageable by axial pressure to cause the pins 33 to penetrate the cores of a cable laid in the channel 32 between the cap and base and to force the lugs 35 through apertures 37 in an annular flange 38 integral with the shroud 31. The flange 38 presents an upwardly directed annular recess 39 which receives the rim of the cap 34. After assembly the teeth 36 engage with the shoulders 40 on the underside of the apertures 37. The lugs 35 are a close fit within the apertures 37 such that passage of the teeth 36 through the apertures 37 involves elastic deformation of the parts, whereby after assembly subsequent dismantling is not ordinarily possible.

The cable which is compressed between the cap and base exits the assembly through glands 41 formed by the cap and base.

As previously mentioned the channel 32 may be separable from the base to give access to a space within the lampholder to house a timer circuit.

Figure 4:
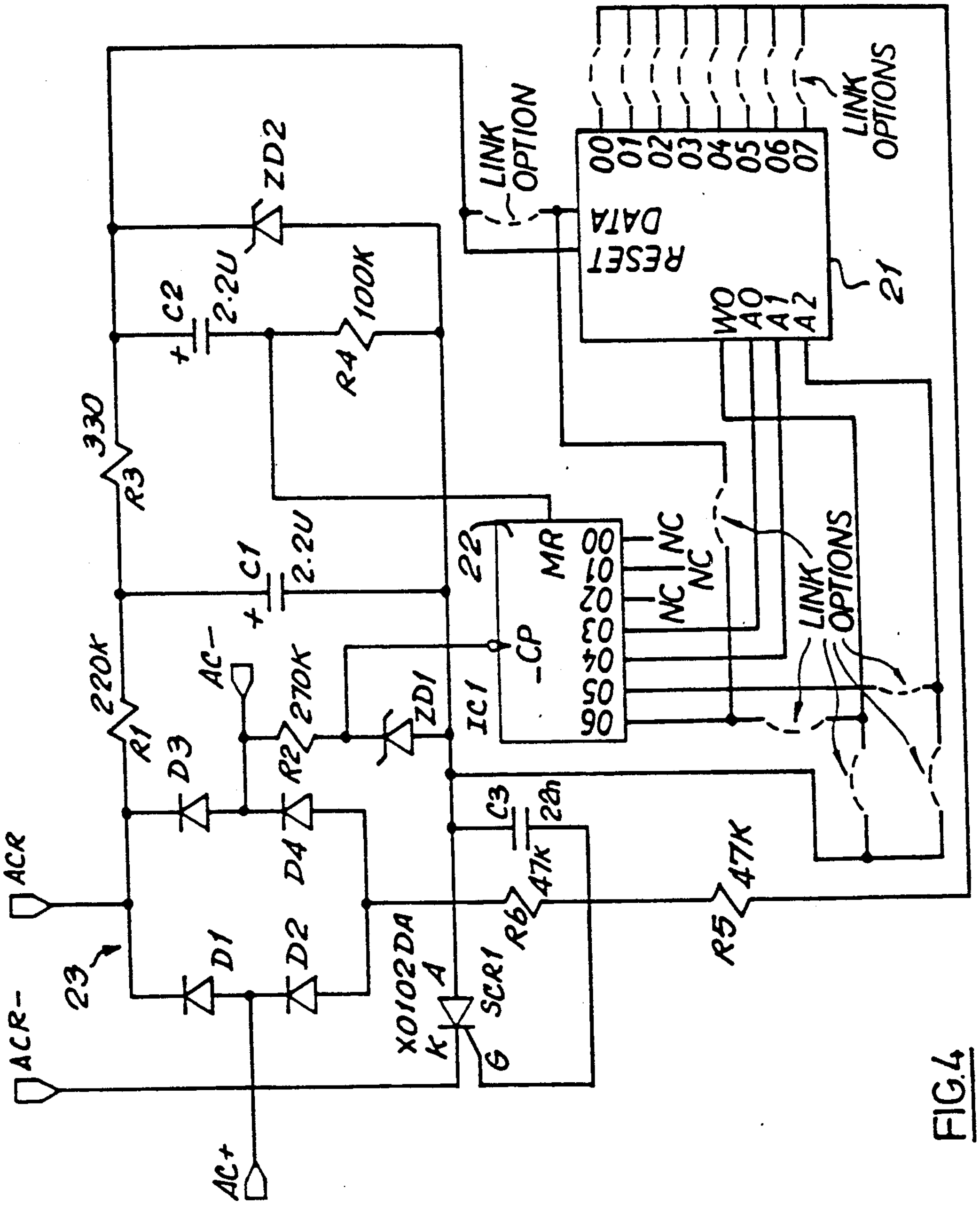
FIG. 4 is a circuit diagram of a timer.

In this way a chasing light system comprising individual timers 11, of which one is illustrated in FIG. 4, for each light 12 of the system, triggered by a common triggering signal to switch the lamps 12 at different times within an operating cycle, may be provided.

FIG. 1 shows a string of lights 12 on a cable 10 and identifies a complete section of eight lights 12(1), 12(2), . . . 12(8) which have timers 11(1), 11(2), . . . 11(8) arranged to switch their associated lamps on at successive say quarter-second intervals during a cycle time of say two seconds. Of course different cycle times may be used to give the effect of faster or slower running waves of light along the string. The timers 11 also switch the lights off in the same sequence. If the lamps are switched off a quarter second after they are switched on, the effect will be that of a single light moving along the string. If they are switched off one and one half or one and three quarter seconds after they are switched on, the effect will be that of a dark patch moving along the lit string.

The triggering signal effectively comes from switching power to the string which sets off all the timers 11 simultaneously. Synchronsim is maintained by the timers being controlled according to the frequency of an a.c. energising current.

FIG. 4 illustrates a circuit for the timers 11 comprising an addressable latch 21 controlling a solid state switch—silicon-controlled rectifier SCR1—and switched by a counter 22 run from pulses derived from the a.c. mains supply at inputs AC+, AC−.

The input a.c. is rectified in a full wave rectifier 23. It is important to rectify the input a.c. in a festoon light system in which the live and neutral wires are tapped using pins which penetrate the cable insulation, and so it will not necessarily be known which pin contacts the live and which the neutral wire.

A pulsed control signal chopped from the a.c. input by zener diode ZD1 is used to control the counter 22 which inputs mains-synchronised control signals to the latch 21 to cause output signals to appear at different times at its outputs 00, . . . 07. Which of these outputs is connected by a link option to the gate G of SCR1 determines at which point in the cycle SCR1 is rendered conductive to close the circuit on rectified AC outputs ACR−, ACR+ to which the lamp is connected.

Further link options between the counter 22 and the latch 21 can be used to energise the outputs at different times in four or sixteen, say, interval cycles.

Resetting the latch 21 is effected by a pulse when zener diode ZD2 discharges a capacitance C2.

I claim:

1. A lampholder fitting for festoon lighting comprising a) a base including a cylindrical shroud extending from a channel in which a cable may be laid.

b) pins projecting into said channel, c) a cap separate from the base, d) a plurality of angularly spaced depending lugs on said cap, and e) a radially directed elastically deformable tooth on the free end of each of said lugs, f) an elastically deformable integral part of the shroud defining apertures having shoulders on the underside thereof, g) the apertures being sized to receive the lugs in a close fit when the cap and base are interengaged by axial pressure to cause the pins to penetrate cores of a cable in the channel, h) whereby the teeth are squeezed through the apertures during the engagement of cap and base by elastic deformation of the teeth and integral part and then egage the shoulders on the underside of the apertures to prevent disassembly of the cap from the base.

2. A lampholder fitting according to claim 1 wherein said integral part of the shroud is a circumferential flange extending radially outwardly and defining a recess in the bottom of which the apertures are defined.

3. A lampholder fitting according to claim 1 wherein the lugs are four in number and are equally angularly spaced around the periphery of the cap.

4. A lampholder fitting according to claim 1 wherein the channel receiving a cable is separable from the base to give access to space within the base to house a miniature circuit assembly.

* * * * *